United States Patent
Ueda et al.

(10) Patent No.: US 8,466,675 B2
(45) Date of Patent: Jun. 18, 2013

(54) DETECTION APPARATUS AND DETECTION METHOD FOR A MAGNETIC SUBSTANCE HAVING A TRAP REGION AND A NON-TRAP REGION

(75) Inventors: Miki Ueda, Tokyo (JP); Takashi Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 783 days.

(21) Appl. No.: 12/664,585

(22) PCT Filed: Jun. 17, 2008

(86) PCT No.: PCT/JP2008/061381
§ 371 (c)(1),
(2), (4) Date: Dec. 14, 2009

(87) PCT Pub. No.: WO2008/156187
PCT Pub. Date: Dec. 24, 2008

(65) Prior Publication Data
US 2010/0188079 A1    Jul. 29, 2010

(30) Foreign Application Priority Data
Jun. 19, 2007   (JP) ................. 2007-161694

(51) Int. Cl.
*G01R 33/02* (2006.01)
*G01R 33/12* (2006.01)
*G01N 27/74* (2006.01)

(52) U.S. Cl.
USPC .......................... 324/249; 324/204

(58) Field of Classification Search
USPC ................................. 324/249, 204
See application file for complete search history.

(56) References Cited

U.S. PATENT DOCUMENTS

| 5,774,430 A | 6/1998 | Ikeda ........................... 369/13 |
| 5,994,899 A | 11/1999 | Mohri .......................... 324/260 |
| 6,232,775 B1 | 5/2001 | Naitoh et al. ................. 324/249 |

(Continued)

FOREIGN PATENT DOCUMENTS

| EP | 0 989 411 A2 | 3/2000 |
| EP | 1 041 391 A2 | 10/2000 |

(Continued)

OTHER PUBLICATIONS

Ferreira et al., "Biodetection Using Magnetically Labeled Biomolecules and Arrays of Spin Valve Sensors (invited)", Journal of Applied Physics, 93(10), pp. 7281-7286 (2003).

(Continued)

*Primary Examiner* — Jay Patidar
(74) *Attorney, Agent, or Firm* — Fitzpatrick, Cella, Harper & Scinto (57) ABSTRACT

A magneto-impedance element with a longitudinal columnar section whose cross section about a longitudinal center axis is either a circle or a polygon inscribed in the circle, and which has a trap region configured to trap a magnetic substance that is formed in a band region extending along at least one of two lines of intersection between a plane containing the center axis and a lateral surface of the longitudinal columnar section and a non-trap region for a magnetic substance that is a region of the lateral surface of the magneto-impedance element excluding the trap region. The magneto-impedance element is used to provide a detection apparatus and a detection method that can easily detect a magnetic substance with high precision.

23 Claims, 6 Drawing Sheets

U.S. PATENT DOCUMENTS

| | | | | |
|---|---|---|---|---|
| 6,239,594 | B1* | 5/2001 | Naito et al. | 324/249 |
| 6,661,703 | B1 | 12/2003 | Ikeda | 365/158 |
| 6,721,201 | B2 | 4/2004 | Ikeda | 365/158 |
| 6,829,121 | B2 | 12/2004 | Ikeda et al. | 360/324.1 |
| 6,898,115 | B2 | 5/2005 | Ikeda | 365/171 |
| 7,035,138 | B2 | 4/2006 | Ikeda et al. | 365/173 |
| 7,420,839 | B2 | 9/2008 | Ikeda et al. | 365/173 |
| 2002/0135364 | A1 | 9/2002 | Ciureanu et al. | 324/249 |
| 2003/0052671 | A1* | 3/2003 | Kawase | 324/249 |
| 2005/0242805 | A1 | 11/2005 | Honkura et al. | 324/249 |
| 2005/0270020 | A1 | 12/2005 | Peczalski et al. | 324/247 |
| 2007/0040551 | A1 | 2/2007 | Ciureanu et al. | 324/244 |
| 2007/0054421 | A1 | 3/2007 | Ueda et al. | 438/3 |

FOREIGN PATENT DOCUMENTS

| | | | |
|---|---|---|---|
| EP | 1 076 243 | A2 | 2/2001 |
| EP | 1 293 792 | A2 | 3/2003 |
| EP | 1 408 562 | A1 | 4/2004 |
| JP | 08-288568 | A | 11/1996 |
| WO | WO 00/03260 | | 1/2000 |
| WO | WO 02/29430 | A1 | 4/2002 |

OTHER PUBLICATIONS

Besse et al., "Detection of Single Magnetic Microbead Using a Minaturized Silicon Hall Sensor", Applied Physics Letters, 80(22), pp. 4199-4201 (2002).

Lee et al., "Magnetic Gradiometer Based on a High-transition Temperature Superconducting Quantum Interference Device for Improved Sensitivity of a Biosensor", Applied Physics Letters 81(16), pp. 3094-3096 (2002).

Richardson et al., "A Novel Measuring System for the Determination of Pragmatic Practicle Labels for Use in Magneto-immunoassays", Biosensors & Bioelectronics, 16, pp. 1127-1132 (2001).

Chiriac et al., "Magnetic GMI Sensor for Detection of Biomolecules", Journal of Magnetism and Magnetic Materials, 293, pp. 671-676 (2005).

Panina et al, "Magnetoimpedance in Amorphous Wires and Multifunctional Applications: From Sensors to Tunable Artificial Microwave Materials", Journal of Magnetism and Magnetic Materials, 272-276, pp. 1452-1459 (2004).

Mahdi et al., "Some New Horizons in Magnetic Sensing: High-$T_c$SQUIDs, GMR and GMI Materials", Sensors and Actuators, A(105), pp. 271-285 (2003).

Knobel et al., "Giant Magnetoimpedance: Concepts and Recent Progress", Journal of Magnetism and Magnetic Materials, 242-245, pp. 33-40 (2002).

Sandacci et al., "Off-Diagonal Impedance in Amorphous Wires and Its Application to Linear Magnetic Sensors", IEEE Transactions on Magnetics, 40(6), pp. 3505-3511 (2004).

Panina et al., "Mechanism of Asymmetrical Magnetoimpedance in Amorphous Wires", Journal of Applied Physics, 85(8), pp. 5444-5446 (1999).

Mohri et al., "Amorphous Wire and CMOS IC-Based Sensitive Micromagnetic Sensors Utilizing Magnetoimpedance (MI) and Stress-Impedance (SI) Effects", IEEE Transactions on Magnetics, 38(5), pp. 3063-3068 (2002).

Hauser et al., "GIANT Magnetoimpedance Sensors", IEEE Instrumentation & Measurement Magazine, pp. 28-32 (2001).

PCT Notification of Transmittal of The International Search Report and The Written Opinion of the International Searching Authority, or The Declaration, dated Jun. 30, 2009, regarding Application No. PCT/JP2008/061381.

H. Chiriac et al., "Magnetic GMI sensor for detection of biomolecules," Journal of Magnetics and Magnetic Materials, 2005, vol. 293, No. 1, pp. 671-676.

International Preliminary Report on Patentability mailed Jan. 7, 2010 in PCT/JP2008/061381.

* cited by examiner

DETECTION APPARATUS AND DETECTION METHOD FOR A MAGNETIC SUBSTANCE HAVING A TRAP REGION AND A NON-TRAP REGION

TECHNICAL FIELD

The present invention relates to a detection apparatus and a detection method for detecting a magnetic substance or detecting a nonmagnetic substance using a magnetic substance as a label.

BACKGROUND ART

Several research institutions have reported biosensors that use a magnetic sensor element to indirectly detect a biomolecular using a magnetic substance as a label. Various types of magnetic sensor elements can be used for this type of detection. For example, there have been proposed a detection method using a magneto-resistance element (H. A. Ferreira, et. al, J. Appl. Phys., 93 7281 (2003)), a detection method using a Hall element (Pierre-A. Besse, et. al, Appl. Phys. Lett. 80 4199 (2002)), a detection method using a Josephson element (SeungKyun Lee. et. al, Appl. Phys. Lett. 81 3094 (2002)), a detection method using a coil (Richard Luxton, et. al, Anal. Chem. 16 1127 (2001)), and a detection method using a magneto-impedance element (Horia Chiriac, et. al, J. Magn. Magn. Mat. 293 671 (2005)). The detection methods for a biologic substance using such elements have different characteristics. In particular, the magneto-impedance element advantageously has a simple structure.

Figure 7:
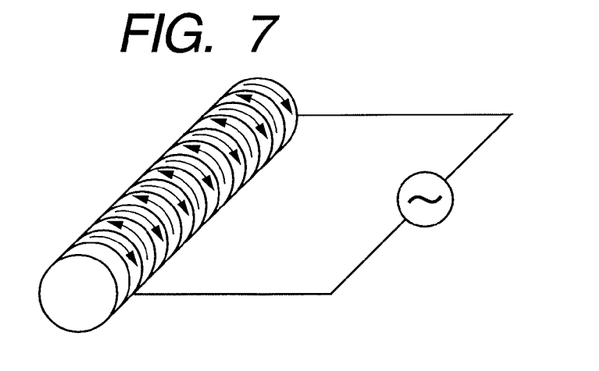
FIG. 7 is a schematic diagram illustrating magnetic domains of the magneto-impedance element and the direction of a current flow.

A magneto-impedance element has an elongated shape and is made of a magnetic material of uniform composition or a nonmagnetic conductor coated with a magnetic material. The magneto-impedance element is more easily magnetized in the direction perpendicular to the longitudinal direction and has a multi-domain structure when no magnetic field is applied thereto (see FIG. 7).

When a high-frequency current flows through the element, the electrons flow through the surface of the element because of the skin effect. If a magnetic field is applied to the element, the magnetic permeability of the element varies, and as a result, the impedance of the element varies depending on the applied magnetic field. That is, the magnitude of the magnetic field applied to the element can be measured by measuring the impedance of the element. However, the magneto-impedance element detects the magnetic field in the longitudinal direction thereof.

In the literature by Horia Chiriac, et al. described above, detection of a DNA using a magneto-impedance element is proposed. A magneto-impedance element is coated with a polymer, and DNA having a desired base sequence is fixed thereto by the action of biotin. The magneto-impedance element is immersed in a solution containing a magnetic substance. However, a DNA to be examined is previously fixed to the magnetic substance by the action of biotin. If the DNA to be examined, that is, the DNA fixed to the magnetic substance in this case is complementary to the DNA fixed to the surface of the magneto-impedance element, The DNAs are bonded to each other, and therefore, the magnetic substance is fixed to the surface of the magneto-impedance element. Since the magneto-impedance element exhibits an impedance depending on the stray magnetic field from the magnetic substance, whether the DNAs are complementary to each other or not can be indirectly detected.

As described in the literature by Horia Chiriac, et al. described above, the impedance is measured with an electric circuit that has a fixed resistor and an alternating-current power supply connected in series with the magneto-impedance element by measuring the voltage across the fixed resistor. The change of the impedance can be determined by comparing the impedances measured before and after the magnetic particle is fixed to the magneto-impedance element. The impedance of the magneto-impedance element after the magnetic substance is fixed thereto depends on the magnitude of the magnetic field applied by the fixed magnetic substance to the magneto-impedance element. However, quantitative measurement of the magnetic substance has been difficult because the magnetic field applied to the magneto-impedance element varies with the position at which the magnetic substance is fixed to the magneto-impedance element.

When the difference of the impedance between before and after the magnetic substance is fixed to the magneto-impedance element is measured, fixing of the target substance labeled with the magnetic particle to the element can take long. In such a case, if the measurement environment such as the element temperature differs between before and after the target substance is fixed, an impedance change independent of the magnetic particle occurs. For example, fixing of a DNA takes several hours. Therefore, the measurement environment has to be strictly controlled for the entire period from before the fixing until the fixing is completed. Therefore, in order to precisely compare the detections signals obtained at significantly different times, a special apparatus can be needed.

DISCLOSURE OF THE INVENTION

An object of the present invention is to provide a detection apparatus and a detection method that enables quantitative measurement of a magnetic substance and can easily detect a magnetic substance with high precision.

The present invention provides a magneto-impedance element with longitudinal columnar section whose cross section about the longitudinal center axis is either a circle or a polygon inscribed in the circle, and has a trap region for a magnetic substance that is formed in a band-like region extending along at least one of two lines of intersection between a plane containing the center axis and a lateral surface of the longitudinal columnar section and a non-trap region for a magnetic substance that is the region of the lateral surface of the magneto-impedance element excluding the trap region.

As a first a detection apparatus for a magnetic substance, the present invention provides a detection apparatus for a magnetic substance including: a magneto-impedance element that has a longitudinal columnar section the cross section of which taken perpendicularly to a center axis thereof is one of a circle centered on the center axis and a polygon inscribed in the circle; a reactive region in which the magneto-impedance element and a magnetic substance are brought into contact with each other; a magnetic field applying unit that applies a magnetic field to the magneto-impedance element; and a detecting unit that detects a change of the impedance based on the magnetic substance trapped by the magneto-impedance element, in which the magneto-impedance element has a trap region for a magnetic substance that is formed in a band-like region extending along at least one of two lines of intersection between a reference plane containing the center axis and a lateral surface of the longitudinal columnar section and a non-trap region for a magnetic substance that is the region of the lateral surface of the magneto-impedance element excluding the trap region.

As a second a detection apparatus for a magnetic substance, the present invention provides a detection apparatus for a magnetic substance including: a magneto-impedance element; a magnetic field applying unit capable of applying a plurality of magnetic fields in different directions; and a detecting unit that detects a change of the impedance of the magneto-impedance element based on a magnetic substance trapped by the magneto-impedance element, in which the magneto-impedance element exhibits the same impedance for magnetic fields of equal magnitude applied in different directions and is capable of trapping a magnetic substance on the surface thereof.

As a third detection apparatus for a magnetic substance, the present invention provides a detection apparatus for a magnetic substance including: a magneto-impedance element; a magnetic field applying unit capable of applying a plurality of magnetic fields in different directions; and a detecting unit that detects a change of the impedance of the magneto-impedance element based on a magnetic substance trapped by the magneto-impedance element, in which the magneto-impedance element has a longitudinal columnar section the cross section of which taken perpendicularly to a center axis thereof is one of a circle centered on the center axis and a polygon inscribed in the circle, exhibits the same impedance for magnetic fields of equal magnitude in different directions, and is capable of trapping a magnetic substance on the surface thereof, and a region capable of trapping the magnetic substance is formed in a band-like region extending along at least one of two lines of intersection between a plane containing the center axis of the magneto-impedance element and a lateral surface of the longitudinal columnar section.

As a first detection method for a magnetic substance, the present invention provides a detection method for a magnetic substance including: bringing a magnetic substance into contact with a magneto-impedance element; applying a magnetic field to the magneto-impedance element; and detecting a change of the impedance of the magneto-impedance element based on the presence or absence of the magnetic substance trapped by the magneto-impedance element, in which the magneto-impedance element with longitudinal columnar section whose cross section about the longitudinal center axis is either a circle or a polygon inscribed in the circle, and has a trap region for a magnetic substance that is formed in a band-like region extending along at least one of two lines of intersection between a plane containing the center axis and a lateral surface of the longitudinal columnar section and a non-trap region for a magnetic substance that is the region of the lateral surface of the magneto-impedance element excluding the trap region.

As a second detection method for a magnetic substance, the present invention provides a detection method for a magnetic substance using a detection apparatus according to one of the first and second aspects described above, in which a magnetic field applying process including applying a magnetic field to a magnetic substance to be detected, stopping the application of the magnetic field and applying a magnetic field to the magnetic substance in a different direction is carried out at least one time, and the magnetic substance is detected by detecting a change of the impedance of a sensor element that occurs in the process.

As a third detection method for a magnetic substance, the present invention provides a detection method for a magnetic substance using a detection apparatus according to the first aspect described above the magnetic field applying unit of which applies a magnetic field in such a way that the direction of a magnetization component of the magnetic substance is parallel to the center axis of the magneto-impedance element, in which after the magnetic field applying unit applies a magnetic field in such a way that the direction of a magnetization component of the magnetic substance is parallel to the center axis of the magneto-impedance element, a detection current is flowed through the magneto-impedance element, and the application of the magnetic field is stopped, and immediately after that, a detection signal of the magnetic substance is acquired.

Further features of the present invention will become apparent from the following description of exemplary embodiments with reference to the attached drawings.

BEST MODES FOR CARRYING OUT THE INVENTION

A detection principle used in a detection apparatus and a detection method for a magnetic substance according to the present invention will be first described.

Figure 8:
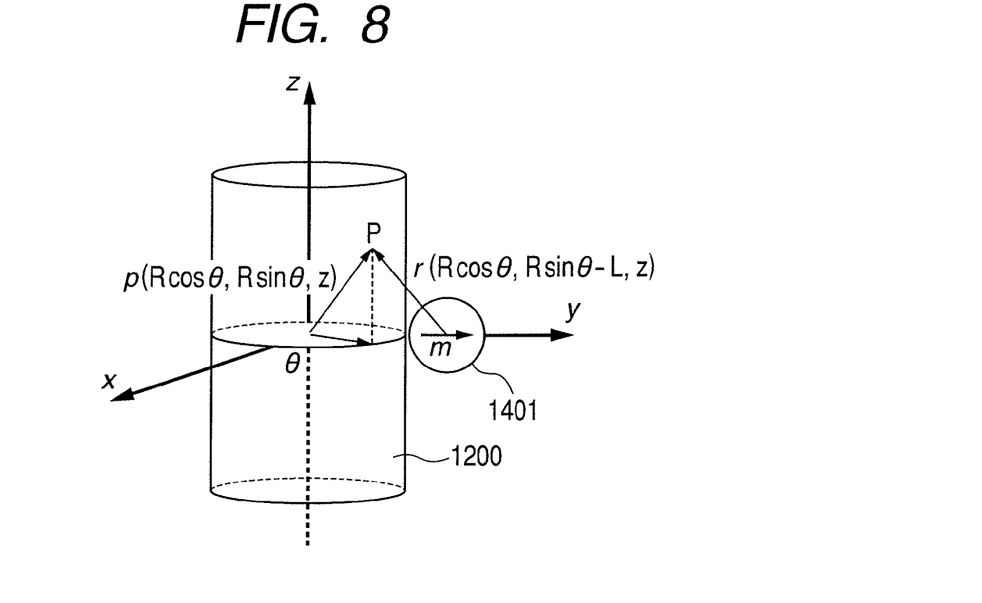
FIG. 8 is a conceptual diagram for illustrating the fact that the detection sensitivity varies with the relationship between the radial direction of the magneto-impedance element and the direction of magnetization of the magnetic substance.

The detection principle according to the present invention will be described with reference to FIGS. 8 to 10 for a case where one magnetic particle having a magnetic moment m is fixed to a magneto-impedance element. The stray magnetic field H formed by a magnetic particle at a point P on a magneto-impedance element shown in FIG. 8 is expressed by the following formula (1).

$$H = -\frac{1}{4\pi\mu_0 r^3}\left[m - \frac{3}{r^2}(mr)r\right] \quad (1)$$

Figure 9A:
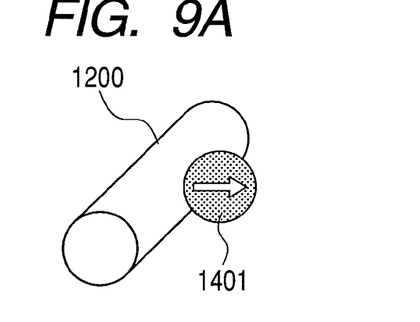
FIGS. 9A and 9B include schematic diagrams for illustrating the fact that the magnitude of the magnetic field applied by the magnetic substance to the magneto-impedance element varies with the position at which the magnetic substance is fixed to the lateral surface of the magneto-impedance element.
Figure 9B:
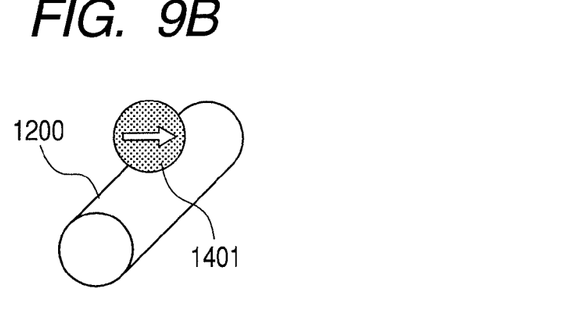
Figure 10A:
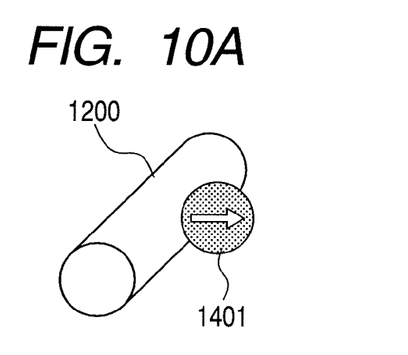
FIGS. 10A and 10B include schematic diagrams for illustrating the fact that the detection sensitivity varies with the relationship between the radial direction of the magneto-impedance element and the direction of magnetization of the magnetic substance.
Figure 10B:
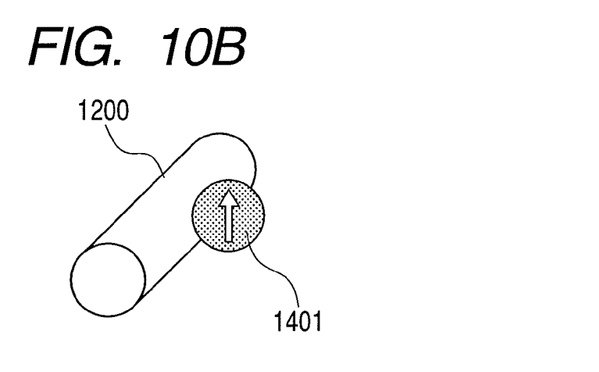

H: magnetic field formed at point P by magnetic substance $\mu_0$: space permeability m: magnetic moment of magnetic substance r: position vector from center of magnetic substance to point P In the following description, if magnetization of the magnetic substance occurs in a radial direction of the magneto-impedance element as shown in FIGS. 9(A) and 10(A), the condition will be described as a condition A. If magnetization of the magnetic substance occurs in the tangential direction of the magneto-impedance element as shown in FIGS. 9(B) and 10(B), the condition will be described as a condition B. For each of these conditions, the formula (I) can be solved as follows.

Here, the magnetic moments m for the conditions A and B are expressed as (0, m, 0) and (m, 0, 0) when we take the coordinate axis as shown in FIG. 8, respectively. Therefore, the magnetic field $H_A$ at the point P in the condition A and the magnetic field $H_B$ at the point P in the condition B are expressed as follows.

$$H_A = -\frac{1}{4\pi\mu_0 r^3}\left[\begin{pmatrix}0\\m\\0\end{pmatrix} - \frac{3}{r^2}\begin{pmatrix}\begin{pmatrix}0\\m\\0\end{pmatrix}(R\cos\theta \quad R\sin\theta-(R+L) \quad z)\end{pmatrix}\begin{pmatrix}R\cos\theta\\R\sin\theta-(R+L)\\z\end{pmatrix}\right]$$

$$H_B = -\frac{1}{4\pi\mu_0 r^3}\left[\begin{pmatrix}m\\0\\0\end{pmatrix} - \frac{3}{r^2}\begin{pmatrix}\begin{pmatrix}m\\0\\0\end{pmatrix}(R\cos\theta \quad R\sin\theta-(R+L) \quad z)\end{pmatrix}\begin{pmatrix}R\cos\theta\\R\sin\theta-(R+L)\\z\end{pmatrix}\right]$$

R: radius of wire-like magneto-impedance element (MI Sensor)

L: radius of bead (magnetic particle)

The z-components of these magnetic fields are expressed as $H_{AZ}$ and $H_{BZ}$. In this description, it is supposed that the longitudinal direction of the MI sensor is aligned with the z-axis, and therefore, only the z-components are detected. The integrals $H_{AZtot}$ and $H_{BZtot}$ of the z-components over the entire surface of the wire-like MI sensor are expressed as follows.

$$H_{AZtot} = \int_0^{2\pi}\int_{-l}^{l}|H_{AZ}|R\,dr\,d\theta$$

$$H_{BZtot} = \int_0^{2\pi}\int_{-l}^{l}|H_{BZ}|R\,dr\,d\theta$$

Supposing that both the radius of the magneto-impedance element and the radius of the magnetic substance are 1, and the length (2l) of the wire is twenty times longer than the diameter of the magnetic substance, $H_{AZtot}/H_{BZtot}=3.91/1.33 (\approx 3)$.

Figure 11:
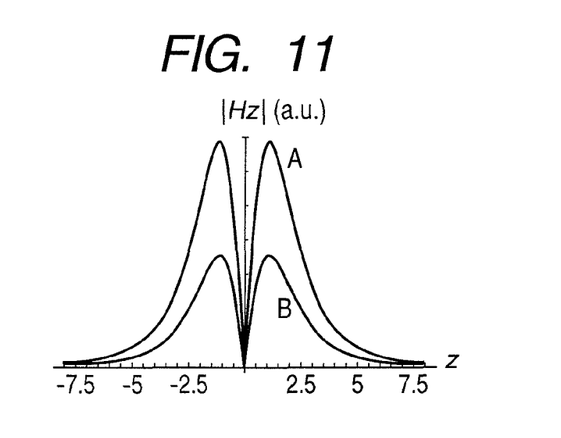
FIG. 11 is a graph illustrating the result of calculation of |Hz| for different relationships between the radial direction of the magneto-impedance element and the direction of magnetization of the magnetic substance.

FIG. 11 shows a graph showing the z-components $[H_{AZ}]_{\theta=0}$ and $[H_{BZ}]_{\theta=0}$ of the magnetic fields detected at a position where $\theta=0$ on the wire surface in the conditions A and B for comparison, in which the abscissa indicates the value of z-coordinate shown in FIG. 8. At the peak positions, $[H_{AZ}]_{\theta=0}$ is about twice as high as $[H_{BZ}]_{\theta=0}$. In terms of integrals ($H_{AZtot}$, $H_{BZtot}$), the magnetic intensity in the condition A is about three times higher than that in the condition B. This shows that the intensity of the magnetic field applied to the magneto-impedance element varies depending on the position at which the magnetic substance is fixed to the magneto-impedance element. In other words, the intensity of the detected signal varies depending on the position at which the magnetic substance is fixed to the magneto-impedance element, and the magnetic substance cannot be quantitatively detected. However, in this calculation, it is supposed that both the radius of the magneto-impedance element and the radius of the magnetic substance are 1. In addition, even if the position of the magnetic substance is fixed, the intensity of the magnetic field applied by the magnetic substance to the magneto-impedance element varies if the direction of the magnetization of the magnetic substance varies. In the graph shown in FIG. 11, the abscissa indicates the distance in the magneto-impedance element in the z-direction normalized with the radius of the magnetic substance.

Thus, the following two detection principles can be derived.

(1) As described above, the detection sensitivity of the magneto-impedance element to a magnetic substance varies depending on the position at which the magnetic substance is fixed to the surface of the magneto-impedance element. Therefore, if the magnetic substance is fixed at a position where the amount of the magnetic substance and the detection sensitivity of the magneto-impedance element to the magnetic substance are substantially in a one-to-one correspondence, variations in the signal intensity in detection of each magnetic substance by the magneto-impedance element are reduced, and the magnetic substance can be quantitatively detected.

(2) The magneto-impedance element and the magnetic field applied thereto are related to each other so that a change of the direction of the applied magnetic field does not cause a change of the impedance of the magneto-impedance element. Thus, if no magnetic substance is fixed to the element, the impedance does not change even if the direction of the applied magnetic field changes, and if a magnetic substance is fixed to the element, the magnitude of the magnetic field applied by the magnetic substance to the magneto-impedance element varies with the direction of the applied magnetic field, and variations of the impedance can be observed. Therefore, the magnetic substance can be detected with high sensitivity.

In the above description of the detection principle (1), it is supposed that one magnetic substance is fixed to the surface of the magneto-impedance element. However, variations of the impedance can also be detected if a plurality of magnetic substances is fixed to the surface of the magneto-impedance element.

In the above description of the detection principle (2), it is supposed that one magnetic substance is fixed to the surface of the magneto-impedance element. However, variations of the impedance can also be detected if a plurality of magnetic substances is fixed to the surface of the magneto-impedance element.

In the following, a detection apparatus and a detection method based on the detection principles (1) and (2) described above will be described.

(A) Magnetic Substance

A magnetic substance as a detection target in the present invention has a shape and a size that allows the magnetic substance to be trapped by a magnetic impedance element directly or indirectly via a non-magnetic substance. For example, a magnetic substance having a spherical shape can be used. To fix the magnetic substance to a trap region of the surface of the magneto-impedance element, a bonding force between Au and thiol can be used, for example. If the surface of the magnetic substance is modified with a substance having a thiol group at an end, and an Au film is formed on the trap region of the surface of the magneto-impedance element, the Au and the thiol bond to each other, and the magnetic substance is fixed to the magneto-impedance element. Alternatively, the surface of the magnetic substance can be coated with an Au thin film, and a thiol group can be fixed in the trap region of the surface of the magneto-impedance element. While the bonding force between Au and a thiol group is used to fix the magnetic substance to the magneto-impedance element in the example described above, any material or method that can selectively fix the magnetic substance to the trap region can be used. The magnetic substance is the target to be directly detected in the present invention. However, if a non-magnetic target substance is labeled with a magnetic substance, the target substance can also be indirectly detected. For example, the presence or absence of an antigen in a sample and even the amount (concentration) thereof can be detected, if the antigen in the sample is trapped by an antibody serving as a trapping agent fixed in the magneto-impedance element, and the antigen trapped by the antibody is labeled with a magnetic substance. The magnetic substance used in this case has a shape and a size suitable for use as a magnetic label. On the other hand, if the magneto-impedance element is capable of trapping the magnetic substance itself, the presence or absence of the magnetic substance in the sample and even the amount (concentration) thereof can be directly detected.

(B) Magneto-Impedance Element

A magneto-impedance element has a longitudinal columnar section that enables detection of a magnetic field in the longitudinal direction used for measurement. The cross section of the longitudinal columnar section taken perpendicularly to the center axis can have any shape that enables detection of a magnetic field in the longitudinal direction. For example, the cross section can have the shape of either a circle or a polygon inscribed in the circle. A common magneto-impedance element is made of a magnetic material of uniform composition or a nonmagnetic conductor coated with a magnetic material. In the latter case, a core of a nonmagnetic material can be coated with a magnetic material serving as a peripheral wall, for example.

Specifically, for example, the detection sensitivity can be improved by providing a part of a nonmagnetic conductive material at the center of an amorphous magnetic wire or a magnetic wire of CoSiB, FeCoSiB, FeCoMoSiB or the like. Such a magneto-impedance element having one of a circular cross section and a polygonal cross section is also suitable for a case where a plurality of magnetic fields in different directions is used.

In the present invention, a magneto-impedance element that has a trap region and a non-trap region for a magnetic substance or a magneto-impedance element that can provide an apparatus with such two regions depending on the placement thereof in the apparatus.

In the case where the magneto-impedance element itself has a trap region and a non-trap region for a magnetic substance, the trap region is located in at least a part of a band-like region extending along at least one of two lines of intersection of a plane including the total length of the center axis of the magneto-impedance element and the lateral surface of the same. Here, the phrase "a plane including the center axis" (referred to as reference plane hereinafter) refers to a hypothetical plane including the center axis, and the trap region is located with reference to the reference plane. Typically, one reference plane is supposed.

Figure 12A:
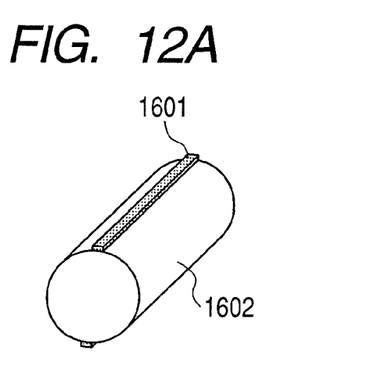
FIGS. 12A and 12B include diagrams illustrating an example of the magneto-impedance element used in the detection apparatus according to the present invention.
Figure 12B:
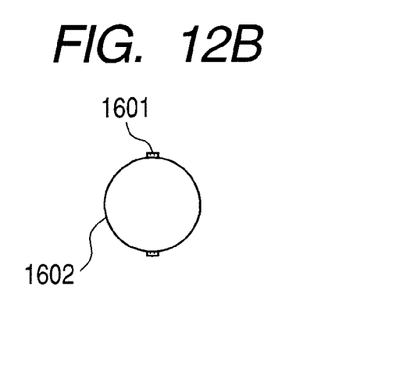

The non-trap region is all the region of the lateral surface of the magneto-impedance element excluding the trap region described above. FIGS. 12A and 12B illustrate examples of the element for which one reference plane is supposed. In the element shown in FIGS. 12A and 12B, a region 1 (1601) is the trap region for the magnetic substance. A region 2 (1602), which is the region of the lateral surface of the magneto-impedance element excluding the region 1, is the non-trap region for the magnetic substance. These regions are separately provided. In the example shown in FIGS. 12A and 12B, the entire band-like region is used as the trap region. In the element shown in FIG. 3, an insulating layer 1203 corresponds to the region 2.

For example, the region 1 (1601) is made of a material having a high affinity for the magnetic substance or a material to which the magnetic substance can be fixed, that is, a material that can be easily trapped. The region 2 (1602) is made of a material having a lower affinity for the magnetic substance or the material to which the magnetic substance can be fixed than the region 1. In this way, the structure having a trap region and a non-trap region described above can be formed. The affinity can gradually vary on the element surface from the region 1 to the region 2 or can suddenly change between the region 1 and the region 2.

Figure 13A:
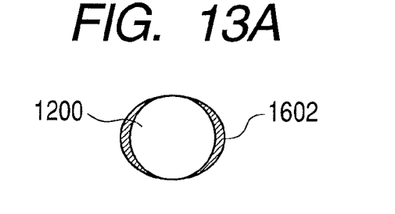
FIGS. 13A and 13B include cross-sectional views illustrating examples of the magneto-impedance element used in the detection apparatus according to the present invention.
Figure 13B:
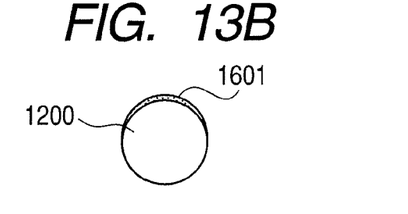

To make the affinity for the magnetic substance or the material to which the magnetic substance can be fixed differ between the regions 1 and 2, the composition of the surface of the magneto-impedance element can be made to differ between the regions 1 and 2 by forming a film on the magneto-impedance element by sputtering, plating, vapor deposition or the like. Alternatively, the affinity for the magnetic substance or the material to which the magnetic substance can be fixed can be made differ between the regions 1 and 2 by changing the thickness or the composition of the film formed on the surface of the magneto-impedance element. Alternatively, as shown in FIG. 13, the material having the higher or lower affinity for the magnetic substance or the material to which the magnetic substance can be fixed can be prepared to be thickest in the region 1 or 2. In the example shown in FIG. 13A, the region 2 (1602) is made of a material having a lower affinity for the magnetic substance or the material to which the magnetic substance can be fixed than the other region. That is, the thickness of the film forming the non-trap region that can hardly trap the magnetic substance is changed in the circumferential direction of the magneto-impedance element. In the example shown in FIG. 13B, the region 1 (1601) is made of a material having a higher affinity for the magnetic substance or the material to which the magnetic substance can be fixed than the other region. That is, the thickness of the film forming the trap region that can easily trap the magnetic substance is changed in the circumferential direction of the magneto-impedance element.

Figure 3:
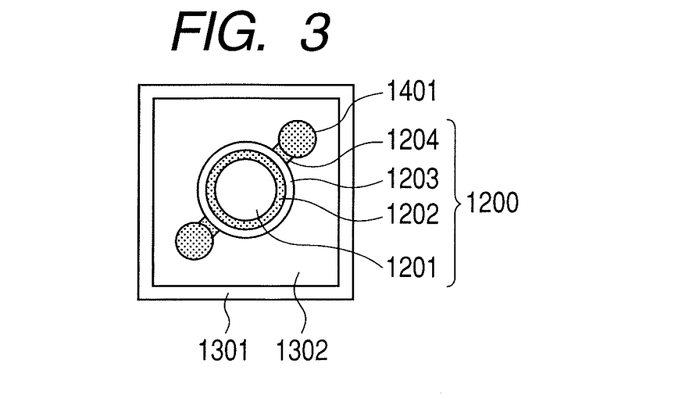
FIG. 3 is a cross-sectional view illustrating an example of a magneto-impedance element used in the detection apparatus according to the present invention.
Figure 19:
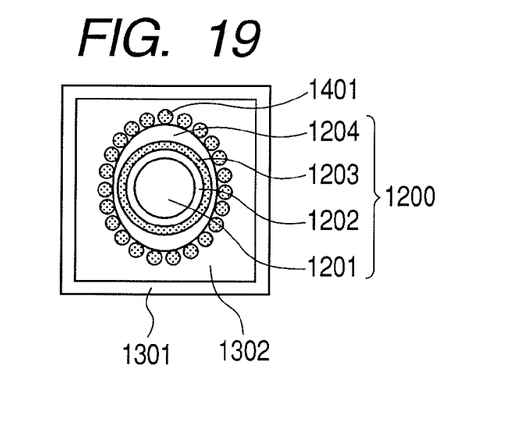
FIG. 19 is a cross-sectional view illustrating the magneto-impedance element used in the detection apparatus according to the present invention to which magnetic substances are fixed.

For a magneto-impedance element having a core of a nonmagnetic material coated with a layer of a magnetic material, the layer described above, the thickness of which varies with the circumferential position on the magneto-impedance element, can be formed by coating at least a part of the layer of a magnetic material with a nonmagnetic material. For example, in the case of the magneto-impedance element constructed as shown in FIG. 3, the layer is formed on at least a part of an insulating thin film 1203 on a layer of a magnetic material (a magnetic film 1202). Alternatively, as shown in FIG. 19, the trap region having a varying thickness can be formed by coating the entire circumferential surface with a film of a nonmagnetic material.

Figure 15:
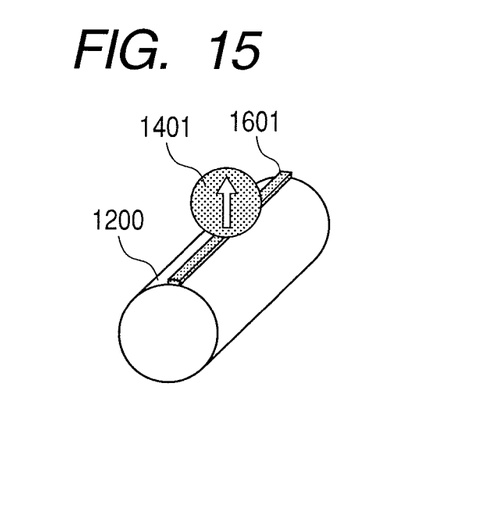
FIG. 15 is a cross-sectional view illustrating the magneto-impedance element used in the detection apparatus according to the present invention to which a magnetic substance is fixed.
Figure 16:
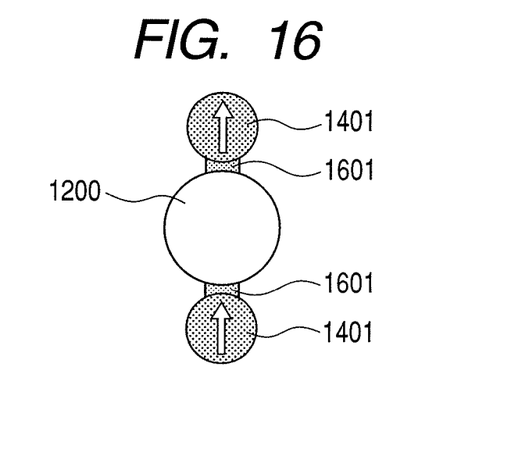
FIG. 16 is a cross-sectional view illustrating the magneto-impedance element shown in FIGS. 12A and 12B and magnetic substances are fixed thereto.

The magneto-impedance element prepared as described above can trap the magnetic substance as schematically shown in FIGS. 15 and 16.

Figure 2:
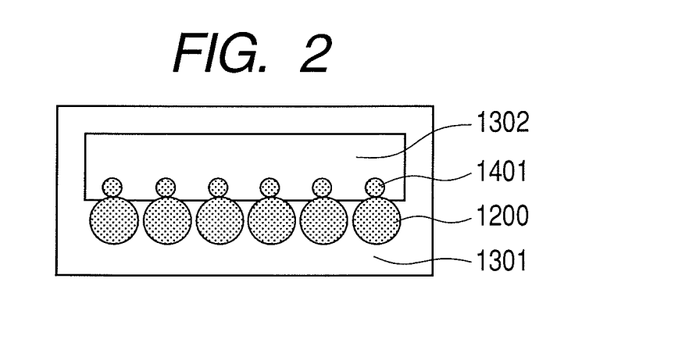
FIG. 2 is a cross-sectional view illustrating an example of a detecting section of a detection apparatus according to the present invention.
Figure 17:
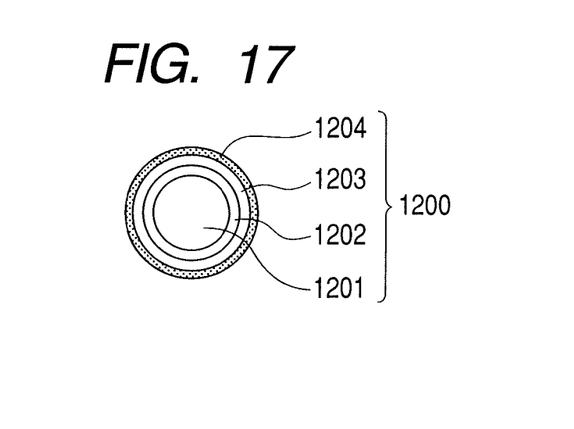
FIG. 17 is a cross-sectional view illustrating an example of the magneto-impedance element used in the detection apparatus according to the present invention.

FIG. 2 illustrates an example of an apparatus in which magneto-impedance elements are arranged to provide the apparatus with the trap region and the non-trap region. In the example shown in FIG. 2, magneto-impedance elements 1200 are embedded in a housing 1301, and surfaces of the magneto-impedance elements are exposed. The exposed surfaces serve as trap regions, and the other surfaces serve as regions that do not come into contact with a sample (non-trap regions). For such an embedded structure, a magneto-impedance element having a trap region (such as the region 1 in FIGS. 12A and 12B) only in a region to be exposed or a magneto-impedance element having a trap region over the entire lateral surface thereof as shown in FIG. 17 can be used.

In a case where a plurality of magnetic fields different in direction is used for detection, the element that has the trap region and the non-trap region or the element that provides the apparatus with the two regions depending on the placement in the apparatus can be used. Alternatively, the magneto-impedance element having the trap region over the entire lateral surface as shown in FIG. 17 can be used. Alternatively, the magneto-impedance element shown in FIG. 19 can also be used. The magnetic substance fixing film of the magneto-impedance element shown in FIG. 19 is not uniform in the circumferential direction of the magneto-impedance element, so that the distance between the magnetic substance and the surface of the magneto-impedance element varies in the circumferential direction. As a result, the effect of the stray magnetic field from the magnetic substance on the magneto-impedance element varies with the position of the trapped magnetic substance.

The band-like region serving as the trap region can be formed of a line of a magnetic material (magnetic particles).

(C) Detection Apparatus and Detection Method Based on Detection Principle (1)

Figure 1:
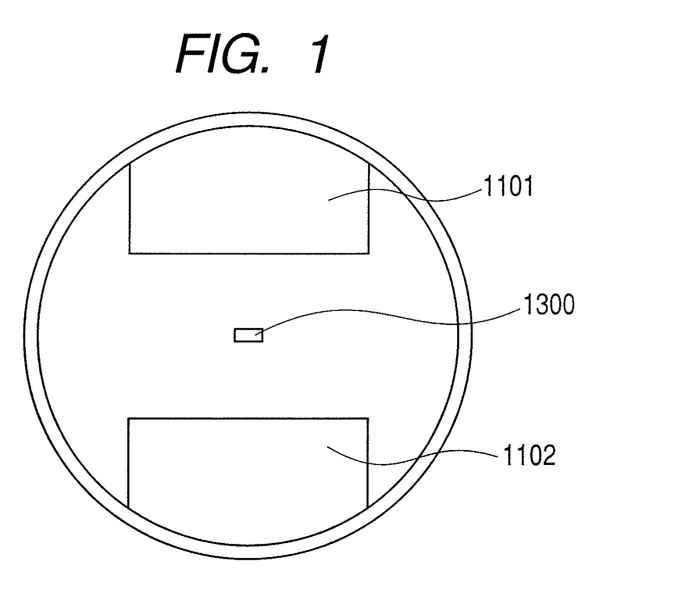
FIG. 1 is a cross-sectional view of an apparatus in measurement in an example 1.

FIG. 1 illustrates an example of an apparatus used for detection of a magnetic substance. FIG. 1 is a schematic cross-sectional view taken perpendicularly to the longitudinal direction of the apparatus. The apparatus shown in FIG. 1 has a detecting section 1300 between magnetic poles 1101 and 1102 that are opposed to each other to form a magnetic field applying unit. The detecting section 1300 has a reactive region (not shown) in which a magneto-impedance element and a sample are brought into contact with each other. The reactive region can be constructed as shown in FIGS. 2 and 3, for example.

Figure 5:
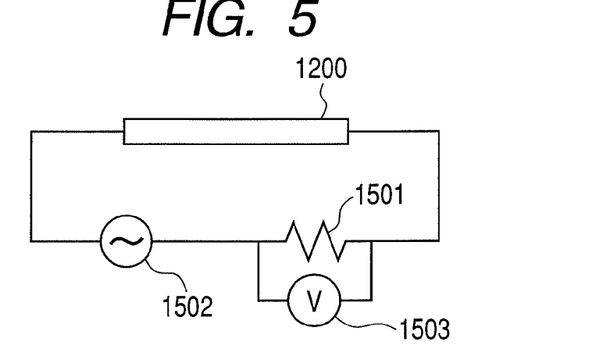
FIG. 5 is a circuit diagram illustrating a detecting circuit of the detection apparatus according to the present invention.

In the apparatus shown in FIG. 1, the magnetic poles 1101 and 1102 apply a magnetic field in one direction. A magneto-impedance element (1200 in FIGS. 2 and 3, for example) disposed in the detecting section is connected to a circuit forming detecting unit. FIG. 5 illustrates an example of a detecting circuit. The both ends of element 1200 are connected to via an alternating-current power supply 1502 and a fixed resistor 1501. The impedance of the element is measured by measuring the voltage across the fixed resistor 1501 with a voltmeter 1503.

In the magneto-impedance element 1200 shown in FIG. 3, a trap region for a magnetic substance is formed by a magnetic substance fixing film 1204 on an insulating film 1203. FIGS. 2 and 3 illustrate states where the sample and the element 1200 are brought into contact with each other, thereby making the magnetic substance fixing film 1204 trap a magnetic substance 1401. In these states, a magnetic field is applied to the detecting section to magnetize the magnetic substance. While the magnetic substance is magnetized, the impedance of the element 1200 is measured with the detecting circuit shown in FIG. 5. Then, the presence or absence of the magnetic substance in the sample or the amount of the magnetic substance trapped by the element can be determined from the difference of the impedance between before and after trapping of the magnetic substance. The magnetic field can be applied to the detecting section 1300 before detection with the detecting circuit or during detection with the detecting circuit (after application of a current).

If a magnetic field applying unit that applies a magnetic field in such a way that the magnetic substance has a magnetization component in the direction parallel to the center axis of the magneto-impedance element is used, detection can be achieved by the following operations, for example.

(i) After the magnetic field applying unit applies a magnetic field in such a way that the magnetic substance has a magnetization component in the direction parallel to the center axis of the magneto-impedance element, a detection current is applied to the magneto-impedance element, the application of the magnetic field is stopped, and immediately after that, a detection signal of the magnetic substance is acquired.

If the relaxation time of the magnetization of the magnetic substance is enough long for the measurement, the magnetic substance can be measured by applying an external magnetic field to the element in the longitudinal direction to align the magnetization of the magnetic substance before measurement and stopping the application of the external magnetic field immediately before detection.

The magnetic field can be applied in any direction as far as the magnetic substance can be detected. As an alternative to applying a magnetic field in the direction parallel to the center axis of the magneto-impedance element as described above, the magnetic field applying unit can apply a magnetic field in such a way that the magnetic substance has a magnetization component in the direction parallel to the straight line extending perpendicularly to the center axis of the magneto-impedance element and passing through the center of the magnetic substance.

In a case where the magnetic field is applied during measurement, the magnetic field is preferably applied in a direction perpendicular to the longitudinal direction of the magneto-impedance element, in which the magnetic field is difficult for the magneto-impedance element to detect.

Magnetic substances can be magnetized in any directions as far as the magnetic substances can be detected. However, the directions are preferably at the same (uniform) angle with respect to a radial axis extending from the center of the element (a radius of the circular cross section or a line extending from the center of an inscribed polygon to a side or apex thereof, for example). If the magnetic field is applied perpendicularly to the longitudinal direction of the magneto-impedance element, the directions of magnetization of the magnetic substances can be aligned to be parallel to one of such radial axes. In particular, as described above with reference to FIGS. 8 to 11, the magnetic substance is preferably magnetized in a radial direction from the center axis of the element (the direction of a radius of the circular cross section or the direction of a line extending from the center of an inscribed polygon to a side or apex thereof, for example). Since magnetic substances are trapped locally at predetermined positions on the lateral surface of the element as shown in FIGS. 2 and 3, the effects of the magnetic fields from the magnetic substances on the impedance of the magneto-impedance element can be made uniform, and therefore, quantitative measurement of the magnetic substances can be improved.

(D) Detection Apparatus and Detection Method Based on Detection Principle (2)

Figure 18:
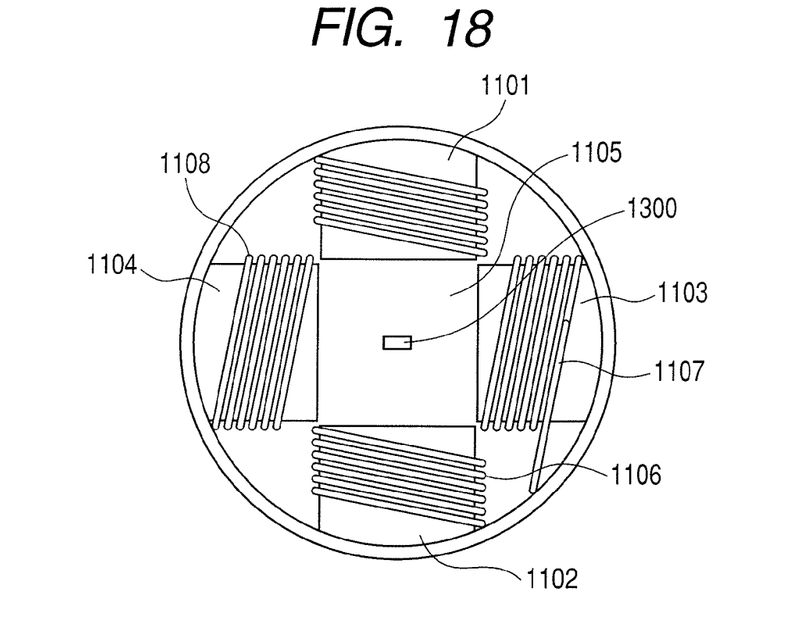
FIG. 18 is a cross-sectional view illustrating an example of the detection apparatus according to the present invention.

FIGS. 1 and 18 illustrate examples of apparatus based on the detection principle (2). In the case where the apparatus shown in FIG. 1 is used, the direction of the magnetic field applied to the detecting section 1300 can be changed by rotating the detecting section 1300 about the longitudinal axis thereof to change the relative position thereof with respect to the magnetic poles 1101 and 1102. An apparatus shown in FIG. 18 has two pairs of magnetic poles disposed perpendicularly to each other and therefore can apply magnetic fields in two different directions without changing the position of the detecting section 1300.

A magneto-impedance element having an impedance that does not change in the absence of a magnetic substance (if no magnetic substance is trapped) even if the direction of application of the magnetic field changes as far as the magnitude is fixed is used for the latter apparatus. As the detection apparatus changes the direction of application of the magnetic field, the amount of change of the impedance of the magneto-impedance element varies if a magnetic substance is trapped by the magneto-impedance element. For example, in the case where the element shown in FIG. 3 is used, if a magnetic substance is trapped and therefore the impedance varies with the direction of the applied magnetic field, the presence or absence of a trapped magnetic substance or the amount thereof can be detected based on the variation of the impedance. If small magnetic substances are fixed to the entire lateral surface of the magneto-impedance element with high density, the change of the impedance of the magneto-impedance element in response to a change of the direction of the magnetic field can become smaller. In such a case, the impedance can be made to more significantly change by making the magnetic substance distribution on the surface of the magneto-impedance element nonuniform. The magnetic substance distribution can be made nonuniform by varying the thickness of the magnetic substance fixing film formed on the surface of the magneto-impedance element in the circumferential direction (see FIG. 19, for example). Alternatively, the magnetic substance distribution can be made nonuniform by limiting the region capable of fixing the magnetic substance (see FIGS. 2, 3 and 11). If the latter structure is used, the advantages described above in the section (C) can also be additionally achieved.

The followings are examples of the detection method using the detection apparatus that uses magnetic fields in different directions.

(1) A magnetic field is applied to a magnetic substance to be detected in a desired direction, and then, a magnetic field is applied to the magnetic substance in a different direction after the application of the first magnetic field is stopped. This magnetic field application process is carried out at least one time. The magnetic substance is detected by detecting a change of the impedance of the sensor element that occurs in the magnetic field application process.

(2) The magnetic field applying unit is capable of rotating about the magneto-impedance element. The direction of the applied magnetic field is changed periodically. Supposing that the frequency of the change of the direction of the magnetic field is f, and the number of directions of the magnetic fields simultaneously applied to the magneto-impedance element is n, the component at a frequency of 2nf is separated from the impedance signal obtained by the detecting unit and detected as a magnetic substance detection signal.

In the detection by such a detection apparatus, measurement can be carried out before the magnetic substance is brought into contact with the magneto-impedance element. However, the measurement is not essential. The presence or absence of a magnetic substance trapped by the magneto-impedance element or the amount thereof can be detected by changing the direction of the applied magnetic field having a fixed magnitude after the magnetic substance is brought into contact with the magneto-impedance element.

Furthermore, the detection method (1) described above can be carried out in the following two ways (A) and (B).

(A) The relative positions of the magnetic field applying unit and the magneto-impedance element are fixed, and the magnetic field applying unit can produce magnetic fields in at least two different directions. In detection of the magnetic substance, only a magnetic field in one direction is applied, and the direction of the magnetic field is gradually changed. The change of the impedance of the magneto-impedance element that occurs when the direction of the magnetic field is changed is detected as a magnetic substance detection signal.

(B) The relative positions of the magnetic field applying unit and the magneto-impedance element are fixed, and the magnetic field applying unit can produce magnetic fields in at least two different directions. Alternating magnetic fields are applied, and the magnetic fields applied in different directions are out of phase with each other. The change of the impedance of the magneto-impedance element that occurs when at least two magnetic fields are simultaneously applied to the magneto-impedance element is detected as a magnetic substance detection signal.

In the detection method (2) described above, when the direction of the applied magnetic field is periodically changed, the change of the impedance, that is, the detection signal of the magnetic substance changes depending on the frequency. Therefore, even if the detection signal is low compared with noise, the magnetic substance can be detected with high sensitivity by extracting only the signal component depending on the frequency of the change of the direction of the applied magnetic field.

In the following, the detection method will be described for a case where the detection apparatus shown in FIG. 1 and the detecting section shown in FIG. 2 are used.

The magnetic poles 1101 and 1102 are rotated about the detecting section 1300 at a frequency f. In this case, the magnetic field is applied in the direction perpendicular to the center axis of the magneto-impedance element, and the direction of magnetization of the magnetic substance is also perpendicular to the center axis. As described above, the impedance of the element differs between the case where the direction of magnetization of the magnetic substance is parallel to a radial direction of the cross section of the magneto-impedance element and the case where the direction of magnetization of the magnetic substance is parallel to the tangential direction of the same, and the impedance also varies periodically as the magnetic field rotates. However, when the magnetic poles make one rotation, the direction of magnetization of the magnetic substance is aligned with the radial direction or tangential direction of the cross section of the element two times. In other words, supposing that the rotational frequency of the magnetic poles is f, the change of the impedance varies at a frequency 2f. Therefore, the magnetic substance can be detected with high sensitivity by detecting only the component at the frequency 2f of the impedance signal. Similarly, in the case where the apparatus shown in FIG. 18 is used, since two pairs of magnetic poles are disposed perpendicularly to each other, supposing that the rotational frequency of the magnetic poles is f, the change of the impedance varies at a frequency 4f. The number of pairs of magnetic poles can be increased as required. If the number of pairs of magnetic poles is n ($n \geq 1$), the component at a frequency 2nf can be separated from the impedance signal and detected.

Methods of changing the direction of the applied magnetic field by rotating the magnetic poles have been described. However, the method of changing the direction of the applied magnetic field is not limited thereto. For example, in the apparatus shown in FIG. 18, the vertical pair of magnetic poles and the horizontal pair of magnetic poles can alternately produce the magnetic field. Alternatively, the magnetic poles can produce an alternating magnetic field, and the phase of the alternating magnetic field produced by the vertical pair of magnetic poles and the phase of the alternating magnetic field produced by the horizontal pair of magnetic poles can be shifted by $\pi/2$ rad.

The directions of the applied magnetic fields of the detection apparatus based on the detection principle (2) are not particularly limited as far as the impedance change that allows detection of the magnetic substance can be detected. However, as shown in FIGS. 1 and 18, the magnetic field is preferably applied in the direction perpendicular to the longitudinal direction of the element (in which the impedance is difficult to detect).

(E) Indirect Detection of Nonmagnetic Substance

Figure 4:
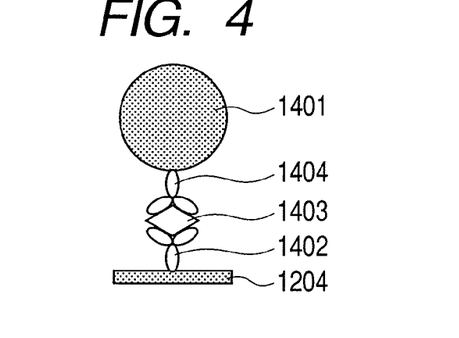
FIG. 4 is a conceptual diagram for illustrating a magnetic substance fixed onto a magnetic substance fixing film by the action of an antigen-antibody reaction.

The trap region on the element can be adapted to trap a nonmagnetic substance, and the nonmagnetic substance trapped in the trap region can be detected using a magnetic substance as a label. FIG. 4 illustrates an example of an arrangement for detecting an antigen 1403 that is a nonmagnetic substance. A primary antibody 1402 is used as a trapping agent. The antigen 1403 in the sample is trapped by the primary antibody 1402, and a secondary antibody 1404 having a magnetic substance 1401 serving as a magnetic label is bonded to the antigen 1403 to form a composite body. In this state, the apparatus described above detects the magnetic substance. From the detection result, the presence or absence of the trapped antigen or the amount thereof can be detected. The nonmagnetic substance, such as a biologic substance, can be detected using various combinations of reactive substances that result in not only a composite body of an antigen and an antibody but also other various specific bondings, such as a hybrid body of nucleic acids and a composite body of a protein and a substrate.

EXAMPLE

Example 1

In this example, an immunosensor using a detection apparatus and a detection method according to the present invention will be described.

(1) Sensor Mechanism

A magneto-impedance element 1200 has a nonmagnetic conductor 1201 made of Cu and having a diameter of 15 μm coated with a magnetic film 1202 made of FeCoSiB and having a thickness of 7.5 μm. On at least a part of the surface of the magnetic film 1202 (a region 1: 1602), a band-like magnetic substance fixing film 1204 made of Au, having a width of 10 to 50 nm and a thickness of 20 nm and extending in the longitudinal direction is formed. In addition, to prevent the detection current from flowing through the magnetic substance fixing film 1204 and the detection signal from decreasing, an insulating thin film 1203 made of $SiO_2$ and having a thickness of 50 nm is formed between the magnetic substance fixing film 1204 and the magnetic film 1202 (see FIG. 3). However, the material and the thickness of each part are not limited to those described above, and any magneto-impedance element that can detect magnetic substances can be used. In this example, a detecting section 1300 has a flow channel 1302 in a housing 1301. The total length (the longitudinal length) of the magneto-impedance element 1200 is about 6 mm, and the magneto-impedance element 1200 is folded in the region of the flow channel 1302. However, such folding is not essential, and one straight magneto-impedance element can also be disposed along the flow channel. Furthermore, the magneto-impedance element 1200 is embedded in the housing 1301 with the top slightly exposed in the flow channel 1302. However, the exposed part is the part that has the magnetic substance fixing film 1204. With such a configuration, magnetic substances 1401 are fixed only to a part of the magneto-impedance element 1200 (see FIG. 2).

(2) Fixing of Magnetic Beads

The magnetic substances 1401 are magnetic beads and are fixed to the magnetic substance fixing film 1204 by the action of a primary antibody 1402, an antigen 1403 and a secondary antibody 1404 (see FIG. 4).

Using the detection apparatus described above, a prostate specific antigen (PSA) 1403, which is known as a marker of prostate cancer, can be detected according to the protocol described below. To the part of the magneto-impedance element 1200 exposed in the flow channel, the primary antibody 1402 that recognizes the PSA 1403 is fixed.

(A) A phosphate buffered saline (a subject body solution) containing PSAs 1403 as a subject body is injected to the flow channel and incubated for 5 minutes.

(B) A phosphate buffered saline is flowed through the flow channel 1302 to remove any unreacted PSAs 1403.

(C) A phosphate buffered saline containing anti-PSA antibodies (the secondary antibody) 1404 labeled with the magnetic substances 1401 is injected into the flow channel 1302 and incubated for 5 minutes.

(D) Any unreacted labeled antibodies are cleaned off with a phosphate buffered saline.

By the protocol described above, the magnetic substances 1401 are fixed to the surface of the magneto-impedance element 1200 by the action of the anti-PSA antibodies (the secondary antibody) 1404, the antigens 1403 and the primary antibodies 1402. That is, if the subject body contains no antigens 1403, the magnetic substances 1401 are not fixed to the top of the magneto-impedance element 1200. Therefore, the antigens 1403 can be detected by detecting the presence or absence of the magnetic substances 1401.

(3) Procedure of Measurement

The basic configuration of the detecting circuit is as shown in FIG. 5. Specifically, an alternating-current power supply 1502 and a fixed resistor 1501 are serially connected to the magneto-impedance element 1200, and the voltage across the fixed resistor 1501 is detected. A detecting section 1300 is disposed at the midpoint between magnetic poles 1101 and 1102. However, FIG. 1 is a cross-sectional view, and the magnetic poles 1101 and 1102 and the detecting section 1300 are elongated in the direction perpendicular to the drawing sheet. The amount of change of the impedance varies depending on whether the magnetic substances 1401 are magnetized in the radial or tangential direction of the magneto-impedance element 1200. Therefore, if the magnetic substances 1401 are magnetized in various directions with respect to the magneto-impedance element, the amount of change of the impedance is not simply proportional to the number of the particles. However, in this example, the change of the impedance can be made proportional to the number of magnetic substances by aligning the directions of magnetization of the magnetic substances 1401 with the radial directions of the magneto-impedance element. Preferably, the directions of magnetization of the magnetic substances are aligned with the radial directions of the magneto-impedance element to increase the sensitivity. From the magnitude of the detection signal from the magneto-impedance element 1200, the number of the fixed magnetic substances 1401 can be determined, and therefore the amount of the antigen 1403 in the subject body can be indirectly determined.

In the example described above, only one flow channel is provided. However, the detecting section can have a plurality of flow channels, and different antigen-antibody reactions can occur in the respective flow channels. In this case, a plurality of antigen can be simultaneously detected.

Example 2

Figure 14:
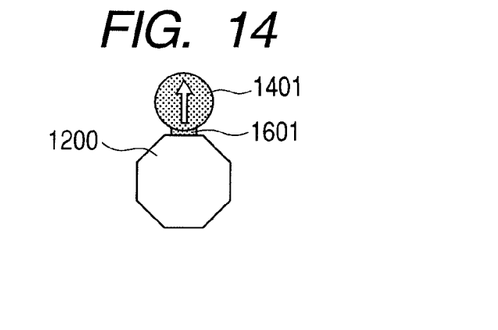
FIG. 14 is a cross-sectional view illustrating an example of the magneto-impedance element used in the detection apparatus according to the present invention to which a magnetic substance is fixed.

The magneto-impedance element in the example 1 can have a polygonal cross section that is symmetrical with respect to the center thereof, as shown in FIG. 14.

Example 3

Figure 6:
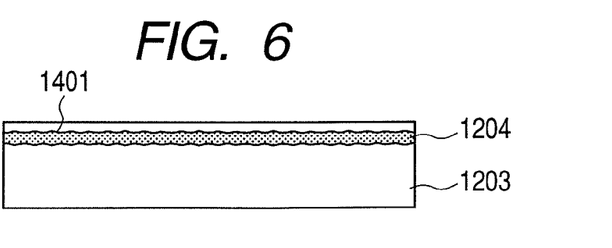
FIG. 6 is a schematic diagram illustrating a lateral surface of the magneto-impedance element shown in FIG. 3 and a magnetic substance fixed thereto.

In the examples 1 and 2, the magnetic substances 1401 can be similarly detected if the magnetic substance fixing film 1204 is locally formed to limit the region to which the magnetic substances 1401 can be fixed as shown in FIG. 6. However, in this case, the insulating film 1202 has to be made of a material to which the magnetic substances 1401 cannot be fixed. For example, in this example, the insulating film is a $SiO_2$ film formed with a plasma-enhanced chemical vapor deposition (CVD) apparatus. To form a uniform insulating film, the magneto-impedance element is rotated about the center axis during formation of the insulating film. Then, the region in which the magnetic substance fixing film is not to be formed is coated with a resist film. Then, an Au film is deposited on the magneto-impedance element with a magnetron sputtering apparatus, and the resist film and the Au film on the resist film are removed. In this way, the magnetic substance fixing film including the Au film is formed only in the region that is not coated with the resist film. In this example, the plasma-enhanced CVD apparatus and the magnetron sputtering apparatus are used for film formation. However, the film formation method is not limited thereto, and any method suitable for formation of the film, such as vapor deposition and plating, can be used.

Example 4

In this example, an immunosensor using a detection apparatus and a detection method according to the present invention will be described. A magneto-impedance element 1200 has a nonmagnetic conductor 1201 made of Cu and having a diameter of 15 μm coated with a magnetic film 1202 made of FeCoSiB and having a thickness of 7.5 μm. On the magnetic film 1202, a magnetic substance fixing film 1204 made of Au and having a thickness of 20 nm is formed. In addition, to prevent the detection current from flowing through the magnetic substance fixing film 1204 and the detection signal from decreasing, a film insulating thin film 1203 made of $SiO_2$ and having a thickness of 50 nm is formed between the magnetic substance fixing film 1204 and the magnetic film 1202 (see FIG. 17). However, the material and the thickness of each part are not limited to those described above, and any magneto-impedance element that can detect magnetic substances can be used.

In this example, a detecting section 1300 has a flow channel 1302 in a housing 1301. The total length of the magneto-impedance element 1200 is about 6 mm, and the magneto-impedance element 1200 is folded in the region of the flow channel 1302. However, such folding is not essential, and one straight magneto-impedance element can also be disposed along the flow channel. Furthermore, the magneto-impedance element 1200 is embedded in the housing 1301 with the top slightly exposed in the flow channel 1302. With such a configuration, magnetic particles 1401 are fixed only to a part of the magneto-impedance element 1200 (see FIG. 2).

The magnetic substances 1401 are fixed to the magnetic substance fixing film 1204 by the action of a primary antibody 1402, an antigen 1403 and a secondary antibody 1404 (see FIG. 4).

A detecting section 1300 is disposed at the midpoint between magnetic poles 1101 and 1102. However, FIG. 1 is a cross-sectional view, and the magnetic poles 1101 and 1102 and the detecting section 1300 are elongated in the direction perpendicular to the drawing sheet. The detecting section and the magnetic poles, the longitudinal directions of which are aligned with the direction perpendicular to the drawing sheet, rotate with respect to each other. Therefore, the direction of the magnetic field applied to the magnetic substances 1401 varies from the radial direction of the magneto-impedance element 1200 to the tangential direction thereof, from the tangential direction to the radial direction, and so on. Therefore, if the magnetic substances 1401 are fixed to the magneto-impedance element 1200, or in other words, if the antigen 1403 exists, the stray magnetic field from the magnetic substances 1401 varies, and as a result, the impedance of the magneto-impedance element 1200 varies. If no magnetic substances 1401 exist, the impedance does not vary.

The basic configuration of the detecting circuit is as shown in FIG. 5. Specifically, an alternating-current power supply 1502 and a fixed resistor 1501 are serially connected to the magneto-impedance element 1200, and the voltage across the fixed resistor 1501 is detected. If the signal is low compared with noise, the magnetic substances can be detected with high sensitivity by extracting the component at a frequency two times higher than the rotational frequency of the magnetic poles from the signal.

Using the detection apparatus described above, a prostate specific antigen (PSA) 1403, which is known as a marker of prostate cancer, can be detected according to the protocol described below. To the part of the magneto-impedance element 1200 exposed in the flow channel, the primary antibody 1402 that recognizes the PSA 1403 is fixed.

(A) A phosphate buffered saline (a subject body solution) containing PSAs 1403 as a subject body is injected to the flow channel and incubated for 5 minutes.

(B) A phosphate buffered saline is flowed through the flow channel 1302 to remove any unreacted PSAs 1403.

(C) A phosphate buffered saline containing anti-PSA antibodies (the secondary antibody) 1404 labeled with the magnetic substances 1401 is injected into the flow channel 1302 and incubated for 5 minutes.

(D) Any unreacted labeled antibodies are cleaned off with a phosphate buffered saline.

By the protocol described above, the magnetic substances 1401 are fixed to the surface of the magneto-impedance element 1200 by the action of the anti-PSA antibodies (the secondary antibody) 1404, the antigens 1403 and the primary antibodies 1402. That is, if the subject body contains no antigens 1403, the magnetic substances 1401 are not fixed to the top of the magneto-impedance element 1200. Therefore, the antigens 1403 can be detected by detecting the presence or absence of the magnetic substances 1401. In addition, form the magnitude of the detection signal from the magneto-impedance element 1200, the number of the fixed magnetic substances 1401 can be determined, and the amount of the antigens 1403 in the subject body can be indirectly determined.

In the example described above, only one flow channel is provided. However, the detecting section can have a plurality of flow channels, and different antigen-antibody reactions can occur in the respective flow channels. In this case, a plurality of antigen can be simultaneously detected.

In this example, the direction of the applied magnetic field is changed by relatively rotating the magnetic poles and the detecting section. However, as shown in FIG. 18, coils can be wound on the magnetic poles that apply a vertical magnetic field to the detecting section and the magnetic poles that apply a horizontal magnetic field to the detecting section, and the magnetic field can be produced by passing a current through the coils. With such a magnetic field applying unit, the magnetic fields can be instantaneously switched without using a rotary mechanism.

Example 5

In this example, a magneto-impedance element 1200 has a nonmagnetic conductor 1201 made of Cu and having a diameter of 15 μm coated with a magnetic film 1202 made of FeCoSiB and having a thickness of 7.5 μm. On the magnetic film 1202, a magnetic substance fixing film 1204 made of Au and having a thickness that varies with position is formed. In addition, to prevent the detection current from flowing through the magnetic substance fixing film 1204 and the detection signal from decreasing, an insulating thin film 1203 made of $SiO_2$ and having a thickness of 50 nm is formed between the magnetic substance fixing film 1204 and the magnetic film 1202. The length of the magneto-impedance element 1200 is 5 mm (see FIGS. 19 and 20).

Figure 20:
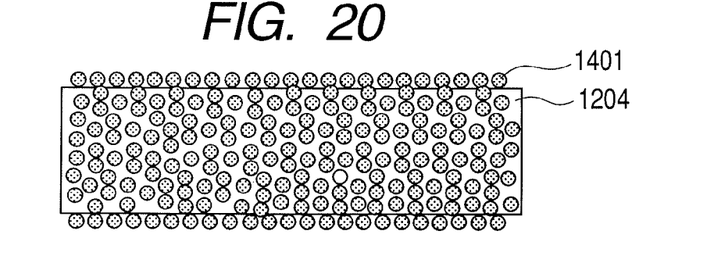
FIG. 20 is a schematic diagram illustrating a lateral surface of the magneto-impedance element shown in FIG. 19 and magnetic substances fixed thereto.

Since the thickness of the magnetic substance fixing film is nonuniform, the distance between the magnetic substances and the surface of the magneto-impedance element varies, so that the effect of the stray magnetic field of the magnetic substances can be changed depending on the positions at which the magnetic substances are fixed. Therefore, while the thickness of the magnetic substance fixing film 1204 is nonuniform in this example, the same effect can be achieved by making the thickness of the insulating thin film 1203 nonuniform. In the case where the magnetic substances 1401 are locally fixed to the magneto-impedance element 1200, the magnetic substances can be detected by the same principle as in the example 1. In the case where the magnetic substances 1401 are fixed to the entire surface of the magneto-impedance element with high density, the impedance varies depending on the direction of the applied magnetic field, because the effect of the stray magnetic field of the magnetic substances 1401 on the magneto-impedance element varies between the case where the magnetic field is applied in the direction in which the magnetic substance fixing film 1204 is thick and the case where the magnetic field is applied in the direction in which the magnetic substance fixing film 1204 is thin. Therefore, again, the magnetic substances 1401 can be detected by changing the direction of the applied magnetic field.

Furthermore, the magnetic substances 1401 can be detected by locally forming the magnetic substance fixing film 1204 to limit the region to which the magnetic substances 1401 can be fixed as shown in FIGS. 3 and 6. In this case, however, the insulating film 1203 has to be made of a material to which the magnetic substances 1401 cannot be fixed.

INDUSTRIAL APPLICABILITY

The detection apparatus and the detection methods according to the exemplary embodiments of the present invention described above enable quantitative measurement of a magnetic substance and precise detection of a magnetic substance or a material that can be fixed to the magnetic substance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-161694, filed Jun. 19, 2007, which is hereby incorporated by reference in its entirety.

The invention claimed is:

1. A magneto-impedance element with a longitudinal columnar section whose cross section about a longitudinal center axis is either a circle or a polygon inscribed in the circle,
   wherein the magneto-impedance element has a trap region configured to trap a magnetic substance that is formed in a band region extending along at least one of two lines of intersection between a plane containing the center axis and a lateral surface of the longitudinal columnar section and a non-trap region for the magnetic substance that is a region of the lateral surface of the magneto-impedance element excluding the trap region.

2. The magneto-impedance element according to claim 1, wherein the magneto-impedance element has a core made of a nonmagnetic material and a coating layer made of a magnetic material that coats a lateral surface of the core.

3. The magneto-impedance element according to claim 1, wherein the lateral surface of the magneto-impedance element is coated with material forming the non-trap region for the magnetic substance, and the trap region for the magnetic substance is formed to cover a part of a surface of the non-trap region.

4. The magneto-impedance element according to claim 1, wherein the lateral surface of the magneto-impedance element is coated with material forming the trap region for the magnetic substance, and the non-trap region for the magnetic substance is formed to cover a part of a surface of the trap region.

5. A detection apparatus for a magnetic substance, comprising:
a reactive region in which the magneto-impedance element and a magnetic substance are brought into contact with each other;
a magnetic field applying unit that applies a magnetic field to the magneto-impedance element; and
a detecting unit that detects a change of an impedance based on the magnetic substance trapped by the magneto-impedance element,
wherein the magneto-impedance element is a magneto-impedance element according to claim 1.

6. The detection apparatus according to claim 5, wherein the magnetic field applying unit applies the magnetic field in one direction.

7. The detection apparatus according to claim 6, wherein the magnetic field applying unit applies the magnetic field in such a way that the direction of a magnetization component of the magnetic substance is parallel to a straight line perpendicular to the center axis of the magneto-impedance element and passes through a center of the magnetic substance.

8. The detection apparatus according to claim 6, wherein the magnetic field applying unit applies the magnetic field in such a way that the direction of a magnetization component of the magnetic substance is parallel to the center axis of the magneto-impedance element.

9. A detection method for a magnetic substance using a detection apparatus according to claim 8,
wherein after the magnetic field applying unit applies a magnetic field in such a way that the direction of a magnetization component of the magnetic substance is parallel to the center axis of the magneto-impedance element, a detection current is flowed through the magneto-impedance element and the application of the magnetic field is stopped, and immediately after that, a detection signal of the magnetic substance is acquired.

10. A detection apparatus, comprising:
a magneto-impedance element;
a magnetic field applying unit for applying a plurality of magnetic fields in different directions; and
a detecting unit that detects a change of an impedance of the magneto-impedance element based on a magnetic substance trapped by the magneto-impedance element,
wherein the magneto-impedance element has a trap region configured to trap the magnetic substance that is formed in a band region extending along at least one of two lines of intersection between a plane containing the center axis and a lateral surface of a longitudinal columnar section of the magneto-impedance element and a non-trap region for the magnetic substance that is a region of the lateral surface of the magneto-impedance element excluding the trap region.

11. A detection method for a magnetic substance using a detection apparatus according to claim 10,
wherein the magnetic field applying process, including applying a magnetic field to the magnetic substance to be detected, stopping the application of the magnetic field, and applying a magnetic field to the magnetic substance in a different direction, is carried out at least one time, and the magnetic substance is detected by detecting a change of the impedance of the magneto-impedance element that occurs in the process.

12. The detection method according to claim 11, wherein a direction of the applied magnetic field is perpendicular to the center axis of the magneto-impedance element.

13. The detection method according to claim 11, wherein the magnetic field applying unit is a mechanism for relatively rotating about the magneto-impedance element, and supposing that the direction of the applied magnetic field changes periodically, the frequency of the change of the direction of the applied magnetic field is f, and the number of magnetic fields simultaneously applied to the magneto-impedance element is n, wherein a component at a frequency 2nf is separated from an impedance signal obtained by the detecting unit and is detected as a magnetic substance detection signal.

14. The detection method according to claim 11, wherein relative positions of the magnetic field applying unit and the magneto-impedance element do not change, the magnetic field applying unit is for producing magnetic fields in at least two different directions, only a magnetic field in one direction is applied in detection of the magnetic substance, the direction of the magnetic field is gradually changed, and a change of the impedance of the magneto-impedance element that occurs when the direction of the magnetic field is changed is detected as a magnetic substance detection signal.

15. The detection method according to claim 11, wherein relative positions of the magnetic field applying unit and the magneto-impedance element do not change, the magnetic field applying unit is for producing magnetic fields in at least two different directions, the magnetic fields are alternating magnetic fields, the magnetic fields applied in different directions are out of phase with each other, and a change of the impedance of the magneto-impedance element that occurs when at least two magnetic fields are simultaneously applied to the magneto-impedance element is detected as a magnetic substance detection signal.

16. A detection apparatus, comprising:
a magneto-impedance element;
a magnetic field applying unit for applying a plurality of magnetic fields in different directions; and
a detecting unit that detects a change of an impedance of the magneto-impedance element based on a magnetic substance trapped by the magneto-impedance element,
wherein the magneto-impedance element has a longitudinal columnar section whose cross section about a longitudinal center axis is either a circle or a polygon inscribed in the circle, and
a region for trapping the magnetic substance formed in a band region extending along at least one of two lines of intersection between a plane containing the center axis of the magneto-impedance element and a lateral surface of the longitudinal columnar section.

17. The detection apparatus according to claim 16, wherein the magneto-impedance element has a core made of a nonmagnetic material and a coating layer made of a magnetic material that coats a lateral surface of the core.

18. The detection apparatus according to claim 17, wherein a film made of a nonmagnetic material is formed on at least a part of the layer made of the magnetic material, and a thickness of the film made of the nonmagnetic material varies in a circumferential direction of the magneto-impedance element.

19. The detection apparatus according to claim 16, wherein the lateral surface of the magneto-impedance element is coated with material forming the non-trap region for the magnetic substance, and the trap region for the magnetic substance is formed to cover a part of a surface of the non-trap region.

20. The detection apparatus according to claim 16, wherein the lateral surface of the magneto-impedance element is coated with material forming the trap region for the magnetic substance, and the non-trap region for the magnetic substance is formed to cover a part of a surface of the trap region.

21. The detection apparatus according to claim 16, wherein the directions of the plurality of magnetic fields are perpendicular to the center axis.

22. A detection method for a magnetic substance, comprising:

bringing a magnetic substance into contact with a magneto-impedance element;

applying a magnetic field to the magneto-impedance element; and detecting a change of an impedance of the magneto-impedance element based on a presence or absence of the magnetic substance trapped by the magneto-impedance element, wherein the magneto-impedance element with a longitudinal columnar section whose cross section about a longitudinal center axis is either a circle or a polygon inscribed in the circle, and has a trap region configured to trap the magnetic substance that is formed in a band region extending along at least one of two lines of intersection between a plane containing the center axis and a lateral surface of the longitudinal columnar section and a non-trap region for the magnetic substance that is a region of the lateral surface of the magneto-impedance element excluding the trap region.

23. The detection method for the magnetic substance according to claim 22, wherein a presence or absence of the magnetic substance or an amount of the magnetic substance is detected by measuring the impedance of the magneto-impedance element before the magnetic substance is brought into contact with the magneto-impedance element, then bringing the magnetic substance into contact with the magneto-impedance element, measuring the impedance of the magneto-impedance element again, and determining the difference of the impedance between before and after the magnetic substance is brought into contact with the magneto-impedance element.

* * * * *